(12) United States Patent
Matsushita et al.

(10) Patent No.: US 10,406,566 B2
(45) Date of Patent: Sep. 10, 2019

(54) SUBSTRATE PROCESSING DEVICE AND SUBSTRATE PROCESSING METHOD

(71) Applicant: SHIBAURA MECHATRONICS CORPORATION, Yokohama-shi, Kanagawa (JP)

(72) Inventors: Jun Matsushita, Yokohama (JP); Yuji Nagashima, Yokohama (JP); Konosuke Hayashi, Yokohama (JP); Kunihiro Miyazaki, Yokohama (JP)

(73) Assignee: SHIBAURA MECHATRONICS CORPORATION, Yokohama-Shi, Kanagawa (JP)

( * ) Notice: Subject to any disclaimer, the term of this patent is extended or adjusted under 35 U.S.C. 154(b) by 236 days.

(21) Appl. No.: 15/608,554

(22) Filed: May 30, 2017

(65) Prior Publication Data

US 2017/0259308 A1 Sep. 14, 2017

Related U.S. Application Data

(62) Division of application No. 14/495,314, filed on Sep. 24, 2014, now abandoned.

(30) Foreign Application Priority Data

Sep. 30, 2013 (JP) .................................. 2013-205172
Jul. 9, 2014 (JP) .................................. 2014-141828

(51) Int. Cl.
*B08B 3/08* (2006.01)
*H01L 21/67* (2006.01)
*B08B 3/02* (2006.01)

(52) U.S. Cl.
CPC .................. *B08B 3/08* (2013.01); *B08B 3/02* (2013.01); *H01L 21/67028* (2013.01); *H01L 21/67034* (2013.01); *H01L 21/67051* (2013.01)

(58) Field of Classification Search
CPC ....... B08B 3/08; B08B 3/02; H01L 21/67028; H01L 21/67034; H01L 21/67051
See application file for complete search history.

(56) References Cited

U.S. PATENT DOCUMENTS 5,882,433 A * 3/1999 Ueno ................ H01L 21/67028
134/31
2001/0047595 A1 12/2001 Mehmandoust
(Continued)

FOREIGN PATENT DOCUMENTS

CN 101573777 A 11/2009
GB 2346953 A 8/2000
(Continued)

OTHER PUBLICATIONS

Notification of Second Office Action (including an English translation thereof) and Search Report issued in the corresponding Chinese Patent Application No. 201410513859.2 dated Jul. 3, 2017.
(Continued)

*Primary Examiner* — Sharidan Carrillo
(74) *Attorney, Agent, or Firm* — Birch, Stewart, Kolasch & Birch, LLP

(57) ABSTRACT

A substrate processing device 10 has a water removing unit 110 and, when a solvent supply unit 58 supplies a volatile solvent to a surface of a substrate W, the water removing unit 110 supplies a water removing agent to the surface of the substrate W to promote replacement of the cleaning water on the surface of the substrate W with the volatile solvent.

4 Claims, 8 Drawing Sheets

(56) References Cited

U.S. PATENT DOCUMENTS

| | | | |
|---|---|---|---|
| 2006/0042722 A1* | 3/2006 | Kim | ............... H01L 21/67034 141/100 |
| 2007/0017555 A1* | 1/2007 | Sekiguchi | ............... B08B 3/02 134/33 |
| 2007/0295365 A1 | 12/2007 | Miya et al. | |
| 2008/0035182 A1 | 2/2008 | Nakatsukasa et al. | |
| 2008/0066337 A1 | 3/2008 | Seki | |
| 2008/0163893 A1 | 7/2008 | Quillen et al. | |
| 2010/0206337 A1 | 8/2010 | Hiroshiro et al. | |
| 2011/0143541 A1 | 6/2011 | Ogawa et al. | |
| 2011/0314689 A1 | 12/2011 | Okuchi et al. | |
| 2011/0315169 A1* | 12/2011 | Minami | ............ H01L 21/67028 134/30 |

FOREIGN PATENT DOCUMENTS

| | | |
|---|---|---|
| JP | 10-195080 A | 7/1998 |
| JP | 2012-9524 A | 7/1998 |
| JP | 2008-34779 A | 2/2008 |
| JP | 2009-38282 A | 2/2009 |
| KR | 10-2008-0025024 A | 3/2009 |
| KR | 10-2012-0129489 A | 11/2012 |

OTHER PUBLICATIONS

Extended European Search Report, dated Feb. 16, 2015, for European Application No. 14187005.5.
Korean Office Action, dated Sep. 22, 2015, for Korean Application No. 10-2014-0106954, along with an English translation.

* cited by examiner

FIG.5
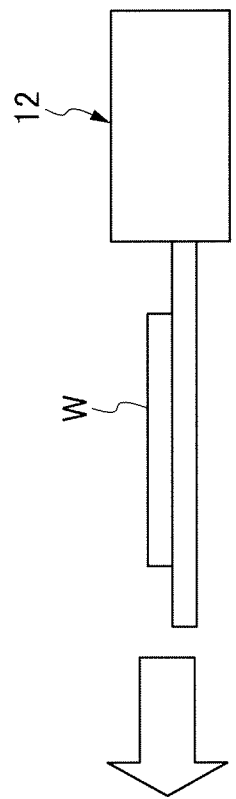
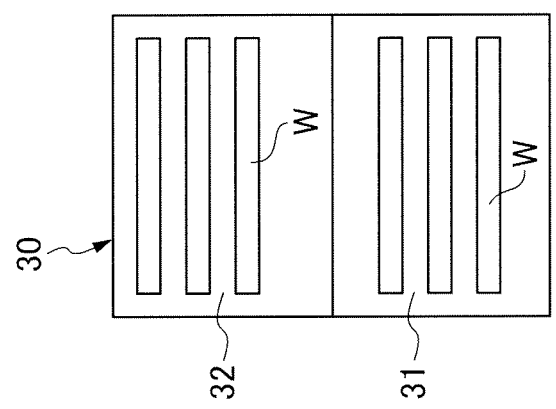

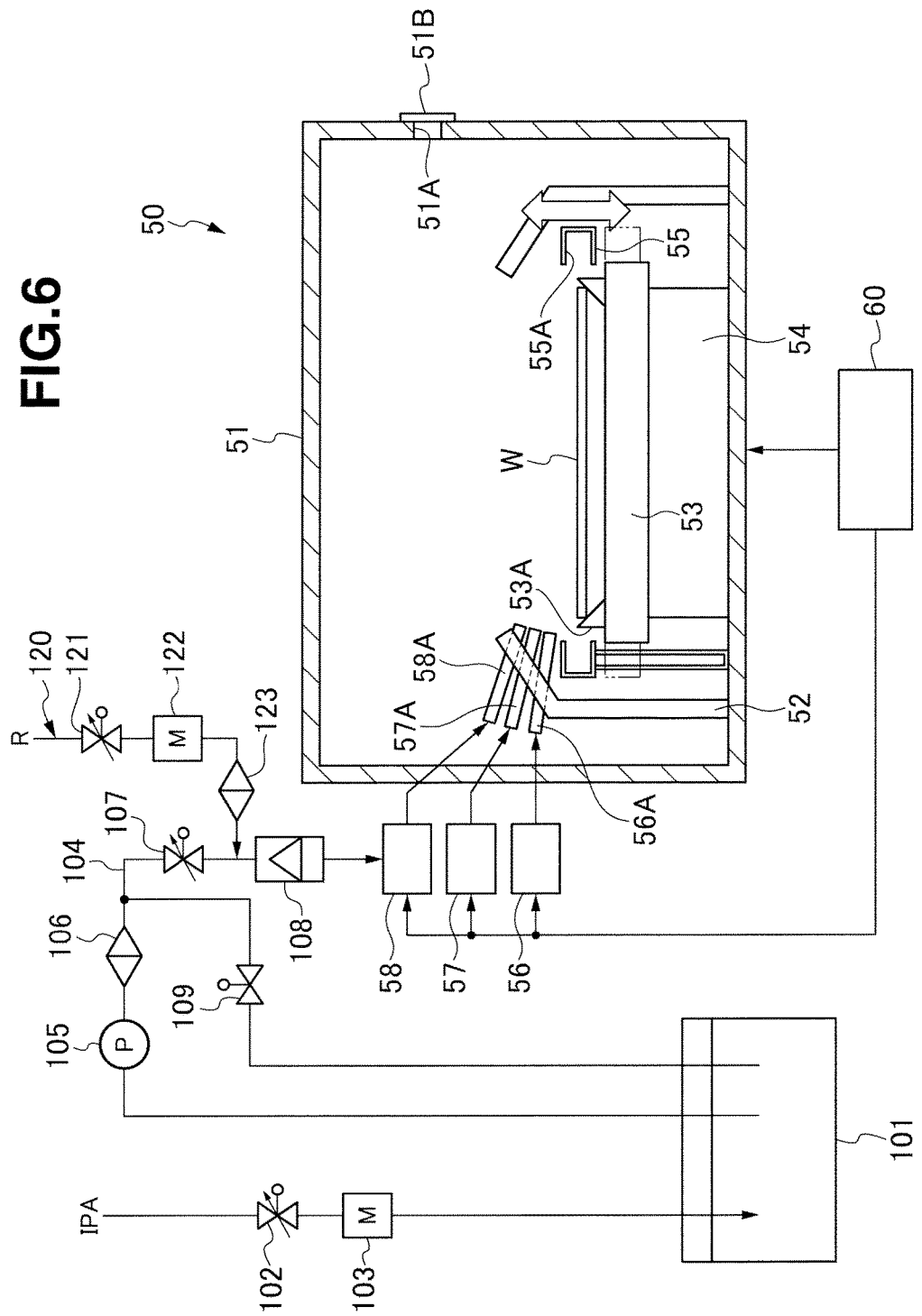

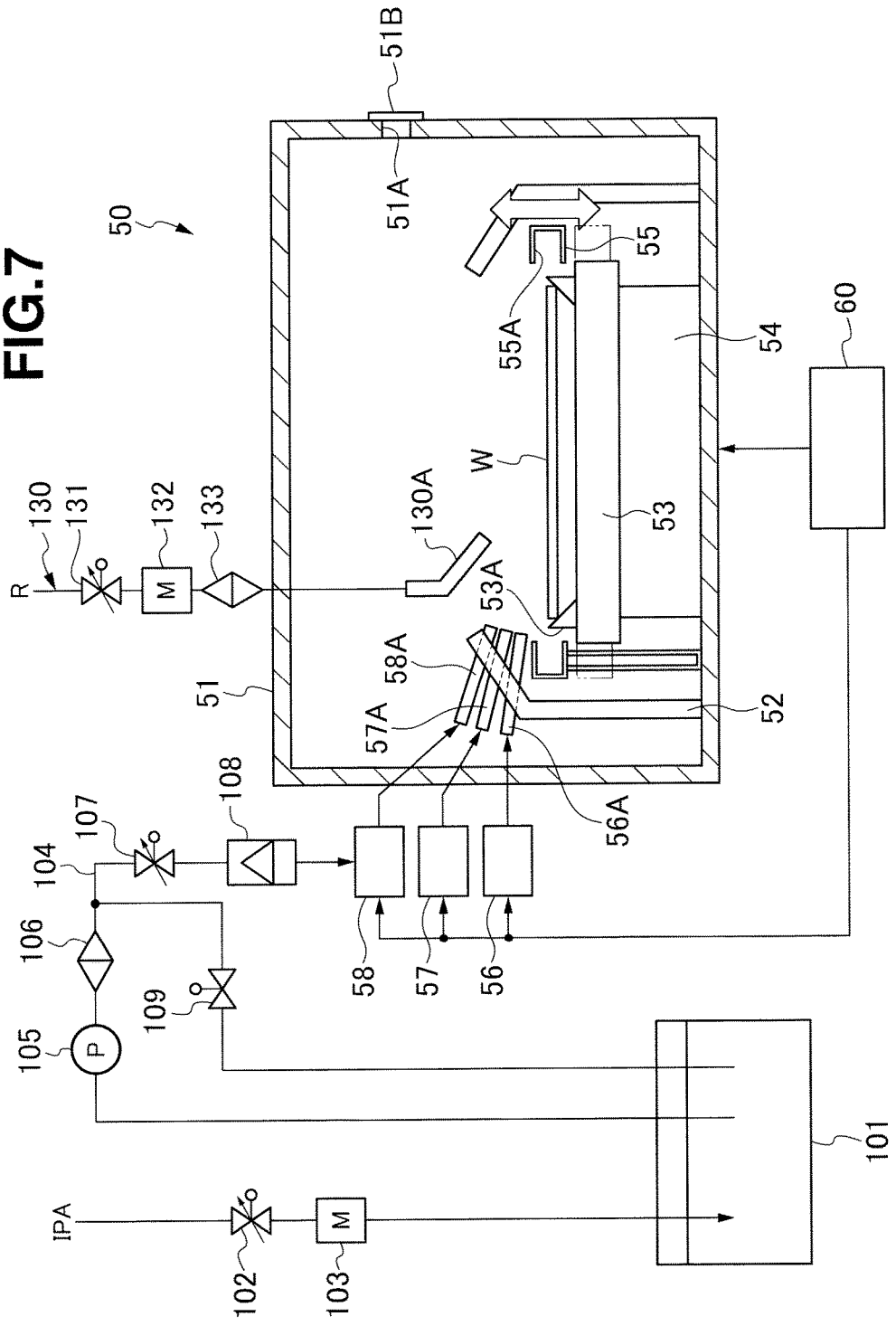

SUBSTRATE PROCESSING DEVICE AND SUBSTRATE PROCESSING METHOD

CROSS-REFERENCE TO RELATED APPLICATIONS

This application is a Divisional of application Ser. No. 14/495,314 filed on Sep. 24, 2014, now abandoned, which claims priority under 35 U.S.C. § 119(a) to Patent Application No. 2013-205172 filed in Japan on Sep. 30, 2013 and Patent Application No. 2014-141828 filed in Japan on Jul. 9, 2014. All of the above applications are hereby expressly incorporated by reference into the present application.

FIELD OF THE INVENTION

The present intention relates to a substrate processing device and a substrate processing method.

RELATED ART

In manufacturing semiconductors, a substrate processing device supplies a processing liquid to a surface of a substrate of a wafer, a liquid crystal substrate or the like to process a surface of the substrate, then supplies cleaning water such as ultrapure water to the substrate surface to clean the substrate surface, and further dries it. In the drying, there are problems that occur with patterns, e.g., around memory cells and gates collapses due to miniaturization according to increase in integration degree and capacity of the semiconductors in recent years. This is due to spacing between patterns, structures of them, a surface tension of the cleaning water and the like. During the substrate drying, since the patterns are mutually pulled by a surface tension of cleaning water that remains between the patterns, the patterns elastically deform and fall so that the pattern collapse occurs.

Accordingly, for the purpose of suppressing the pattern collapsing, such a substrate drying method has been proposed (e.g., see JP 2008-34779 A (Patent Literature 1)) that uses IPA (2-Propanol: Isopropyl Alcohol) having a smaller surface tension than the ultrapure water, and mass production factories and the like have employed a method of drying the substrate by replacing the ultrapure water on the substrate surface with the IPA.

[Patent Literature 1] Japanese Patent Application Publication No. 2008-34779

SUMMARY OF THE INVENTION

Problems to be Solved by the Invention

In the prior art, however, the cleaning water supplied to the surface of the substrate cannot be sufficiently replaced with the volatile solvent such as IPA without difficulty, and the pattern collapse during the substrate drying cannot be effectively prevented. This pattern collapse becomes more remarkable as the semiconductors are miniaturized to a further extent.

An object of the invention is to prevent effectively the pattern collapse during the substrate drying by reliably replacing the cleaning water on the substrate surface with the volatile solvent.

Means for Solving the Problems

A substrate processing device according to an embodiment of the invention includes:

a cleaning water supply unit supplying a cleaning water to a surface of a substrate; and a solvent supply unit supplying a volatile solvent to the surface of the substrate supplied with the cleaning water, and replacing the cleaning water on the surface of the substrate with the volatile solvent, wherein the substrate processing device further includes a water removing unit, and when the solvent supply unit supplies the volatile solvent to the surface of the substrate, the water removing unit supplies a water removing agent to the surface of the substrate, and promotes the replacement of the cleaning water on the surface of the substrate with the volatile solvent.

A substrate processing method according to the embodiment of the invention includes the steps of:

supplying a cleaning water to a surface of a substrate; and supplying a volatile solvent to the surface of the substrate supplied with the cleaning water, and replacing the cleaning water on the surface of the substrate with the volatile solvent, wherein when the volatile solvent is supplied to the surface of the substrate, a water removing agent is supplied to the surface of the substrate by a water removing unit, and replacement of the cleaning water on the surface of the substrate with the volatile solvent is promoted.

Effect of the Invention

The substrate processing device and the substrate processing method according to the invention can reliably replace the cleaning water on the substrate surface with the volatile solvent, and thereby can effectively prevent the pattern collapse during the substrate drying.

BRIEF DESCRIPTION OF DRAWINGS

FIG. 5 is a schematic view illustrating a structure of a transporting unit in the substrate processing device;

FIG. 6 is a schematic view illustrating a modification of a water removing unit;

FIG. 7 is a schematic view illustrating a modification of a water removing unit.

DETAILED DESCRIPTION

Figure 1:
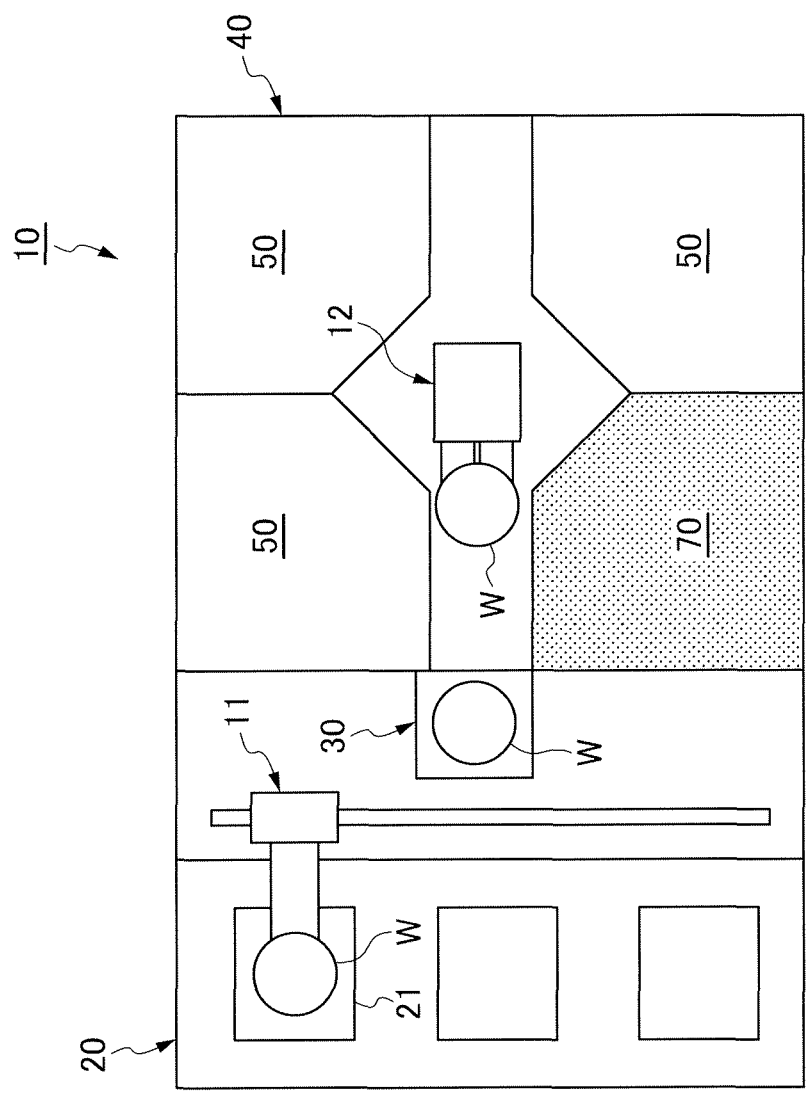
FIG. 1 is a schematic view of a substrate processing device.

A substrate processing device 10 includes, as illustrated in FIG. 1, a substrate supply/discharge unit 20, a substrate storing buffer unit 30, and a plurality of substrate processing chambers 40. A transporting robot 11 is arranged between the substrate supply/discharge unit 20 and the substrate storing buffer unit 30, and a transporting robot 12 is arranged between the substrate storing buffer unit 30 and the substrate processing chamber 40. The substrate processing chamber 40 is formed of a set of a substrate cleaning chamber(s) 50 and a substrate drying chamber(s) 70, as will be described later.

The substrate supply/discharge unit 20 can transfer a plurality of substrate storing cassettes 21 therefor and thereto. The substrate storing cassette 21 stores a plurality of substrates W such as unprocessed wafers, liquid crystal substrates and the like, and is transferred into the substrate supply/discharge unit 20. The substrate storing cassette 21 stores the substrates W processed in the substrate processing chamber 40, and is transferred from the substrate supply/discharge unit 20. The unprocessed substrates W are successively taken out by the transporting robot 11 from multi-level storage shelves of the substrate storing cassette 21 in the substrate supply/discharge unit 20, and are supplied to an in-dedicated buffer 31 (to be described later) of the substrate storing buffer unit 30. The unprocessed substrate W supplied to the in-dedicated buffer 31 is further taken out by the transporting robot 12, and is supplied to the substrate cleaning chamber 50 of the substrate processing chamber 40 for the cleaning processing. The substrate W cleaned in the substrate cleaning chamber 50 is moved by the transporting robot 12 from the substrate cleaning chamber 50 to the substrate drying chamber 70, and is subjected to drying processing. The transporting robot 12 takes out the substrate W thus processed from the substrate drying chamber 70, and puts it into an out-dedicated buffer 32 (to be described later) of the substrate storing buffer unit 30 for temporary storage. The transporting robot 11 takes out the substrates W temporarily stored in the out-dedicated buffer 32 of the substrate storing buffer unit 30, and successively discharges them onto empty shelves in the substrate storing cassette 21 of the substrate supply/discharge unit 20. The substrate storing cassette 21 filled with the processed substrates W is discharged from the substrate supply/discharge unit 20.

The substrate storing buffer unit 30 is provided, as illustrated in FIG. 5, with the plurality of in-dedicated buffers 31 taking the form of multi-level shelves for storing the unprocessed substrates W as well as the plurality of out-dedicated buffers 32 taking the form of multi-level shelves for storing the substrates W subjected to the cleaning and drying processing in the substrate processing chamber 40. A cooling unit for cooling the temporarily stored substrates W may be arranged in the out-dedicated buffer 32. The in-dedicated buffer 31 and/or the out-dedicated buffer 32 may have structures other than the multi-level shelves.

The substrate processing chamber 40 has a set of the substrate cleaning chamber 50 and the substrate drying chamber 70 located around (or on the opposite sides of) the transporting robot 12 positioned in a travel end remote from the substrate storing buffer unit 30 and close to the substrate processing chamber 40, and is configured to move the substrate W cleaned in the substrate cleaning chamber 50 to the substrate drying chamber 70 in the same set for drying it. The substrate processing chamber 40 is configured such that numbers i and j of the substrate cleaning chambers 50 and the substrate drying chambers 70 in the same set satisfy the relationship of (i:j=N:1) where N is the cleaning operation time in the substrate cleaning chamber 50 when the drying operation time in the substrate drying chamber 70 is 1. Accordingly, when all the substrate cleaning chamber(s) 50 and the substrate drying chamber(s) 70 forming the one set in the substrate processing chamber 40 operate in parallel within the same time period, a production quantity of the substrate cleaning chamber(s) 50 cleaning the substrates W can be substantially equal to a production quality of the substrate drying chamber(s) 70 drying the preceding substrates W already cleaned in the substrate cleaning chambers 50.

In each of the multiple levels (e.g., three levels) of the substrate processing chamber 40 of the embodiment, the substrate cleaning chambers 50 and the substrate drying chamber 70 forming the one set are arranged, and the drying operation time of the substrate drying chamber 70 is 1 when the cleaning operation time N of the substrate cleaning chamber 50 is 3 (N=3). Therefore, the substrate processing chamber 40 of the embodiment is provided at each level with the substrate cleaning chambers 50 of i=3 in number and the substrate drying chamber 70 of j=1 in number.

The substrate cleaning chamber 50 and the substrate drying chamber 70 forming the substrate processing chamber 40 will be described below in detail.

Figure 2:
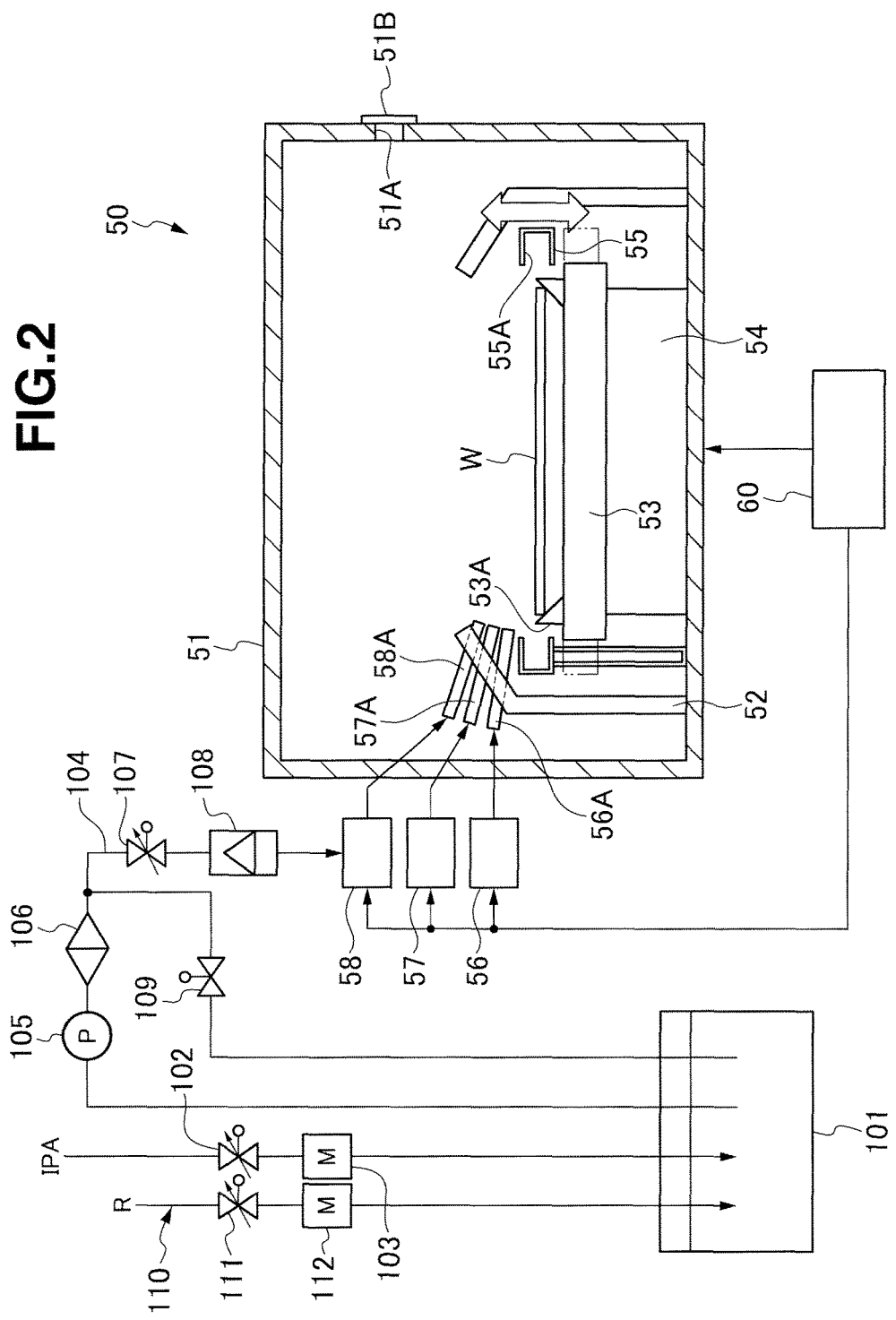
FIG. 2 is a schematic view illustrating a structure of a substrate cleaning chamber in the substrate processing device.

The substrate cleaning chamber 50 includes, as illustrated in FIG. 2, a processing box 51 forming a processing chamber, a cup 52 arranged in the processing box 51, a table 53 horizontally carrying the substrate W in the cup 52, a rotation mechanism 54 rotating the table 53 in a horizontal plane, and a solvent suction discharging unit 55 that is vertically movable around the table 53. Further, the substrate cleaning chamber 50 includes a chemical solution supply unit 56 supplying a chemical solution to a surface of the substrate W on the table 53, a cleaning water supply unit 57 supplying a cleaning water to a surface of the substrate W on the table 53, a solvent supply unit 58 supplying a volatile solvent, and a controller 60 controlling the various portions.

The processing box 51 has a substrate inlet/outlet opening 51A opening at a portion of its peripheral wall. A shutter 51B can close and open the substrate inlet/outlet opening 51A.

The cup 52 has a cylindrical form, surrounds the periphery of the table 53, and accommodates it. The cup 52 has a peripheral wall having an upper portion tapered to converge upward, and has an opening to expose the substrate W on the table 53 upward. This cup 52 receives the chemical solution and cleaning water that flow or disperse from the rotating substrate W. The cup 52 is provided at its bottom with a discharge pipe (not illustrated) for discharging the received chemical solution and cleaning water.

The table 53 is positioned near a center of the cup 52, and is rotatable in the horizontal plane. The table 53 has a plurality of support members 53A such as pins, which removably hold the substrate W such as a wafer or a liquid crystal substrate.

The rotation mechanism 54 has a rotation shaft coupled to the table 53, a motor serving as a drive source for rotating the rotation shaft, and the like (not illustrated), and rotates the table 53 by the driving of the motor through the rotation shaft. The rotation mechanism 54 is electrically connected to the controller 60, which controls the drive of the rotation mechanism 54.

The solvent suction discharging unit 55 includes a solvent absorbing port 55A having an annular opening surrounding the periphery of the table 53. The solvent suction discharging unit 55 has an elevator mechanism (not illustrated) for vertically moving the solvent absorbing port 55A, and vertically moves the solvent absorbing port 55A between a standby position where the solvent absorbing port 55A is positioned lower than the table surface of the table 53 and an operation position where the solvent absorbing port 55A is positioned around the substrate W held by the table 53. The solvent absorbing port 55A absorbs and receives the volatile solvent dispersed from the rotating substrate W. The solvent absorbing port 55A is connected to an exhaust fan or a vacuum pump (not illustrated) for absorbing the volatile solvent as well as an exhaust pipe (not illustrated) for discharging the volatile solvent that is absorbed and received.

The chemical solution supply unit 56 has a nozzle 56A discharging the chemical solution obliquely to the surface of the substrate W on the table 53, and supplies the chemical solution such as APM (Ammonia and hydrogen Peroxide Mixture) for organic substance removing to the surface of the substrate W on the table 53 through the nozzle 56A. The nozzle 56A is attached to an upper portion of the peripheral wall of the cup 52, and its angle, discharging flow velocity and the like are adjusted to supply the chemical solution to the vicinity of the surface center of the substrate W. The chemical solution supply unit 56 is electrically connected to the controller 60, which controls the drive of the chemical solution supply unit 56. The chemical solution supply unit 56 includes a tank storing the chemical solution, a pump serving as a drive source, a valve serving as a regulator valve regulating a supply rate, and the like, although not illustrated.

The cleaning water supply unit 57 has a nozzle 57A discharging the cleaning water obliquely to the surface of the substrate W on the table 53, and supplies the cleaning water such as pure water (ultrapure water) for cleaning processing to the surface of the substrate W on the table 53 through the nozzle 57A. The cleaning water supplied from the cleaning water supply unit 57 may be functional water of, for example, ozone. The nozzle 57A is attached to the upper portion of the peripheral wall of the cup 52, and its angle, discharging flow velocity and the like are adjusted to supply the cleaning water to the vicinity of the surface center of the substrate W. The cleaning water supply unit 57 is electrically connected to the controller 60, which controls the drive of the cleaning water supply unit 57. The cleaning water supply unit 57 includes a tank storing the cleaning water, a pump serving as a drive source, and a valve serving as a regulator valve regulating a supply rate, although not illustrated.

The solvent supply unit 58 has a nozzle 58A discharging the volatile solvent obliquely to the surface of the substrate W on the table 53, and supplies the volatile solvent such as IPA to the surface of the substrate W on the table 53 through the nozzle 58A. The solvent supply unit 58 supplies the volatile solvent to the surface of the substrate W cleaned with the cleaning water supplied by the cleaning water supply unit 57, and replaces the cleaning water on the surface of the substrate W with the volatile solvent. The nozzle 58A is attached to the upper portion of the peripheral wall of the cup 52, and its angle, discharging flow velocity and the like are adjusted to supply the volatile solvent to the vicinity of the surface center of the substrate W. The solvent supply unit 58 is electrically connected to the controller 60, which controls the drive of the solvent supply unit 58. The solvent supply unit 58 includes a tank storing the volatile solvent, a pump serving as a drive source, and a valve serving as a regulator valve regulating a supply rate, although not illustrated.

In addition to the IPA, monovalent alcohols such as ethanol, and ethers such as diethyl ether and ethyl methyl ether as well as ethylene carbonate and the like may be used as the volatile solvent. The volatile solvent is preferably water-soluble.

The solvent supply unit 58 has a solvent supply tank 101 illustrated in FIG. 2. For example, the IPA is supplied into the solvent supply tank 101 through a flow control valve 102 and a flow meter 103. By driving a pump 105 arranged in a solvent supply passage 104, the IPA stored in the solvent supply tank 101 is supplied through a filter 106, a flow control valve 107, and a flow meter 108 and is discharged from a nozzle 58A of the solvent supply unit 58 to the surface of the substrate W. 109 indicates a return valve operating when the IPA is not discharged from the nozzle 58A. The controller 60 controls the flow control valve 102, the pump 105, the flow control valve 107 and the like to discharge an appropriate amount of IPA from the nozzle 58A at an appropriate time.

The solvent supply unit 58 additionally includes a water removing unit 110. When the solvent supply unit 58 supplies the volatile solvent to the surface of the substrate W, the water removing unit 110 supplies a water removing agent to the surface of the substrate W, and thereby promotes the replacement of the cleaning water on the surface of the substrate W with the volatile solvent.

Figure 3:
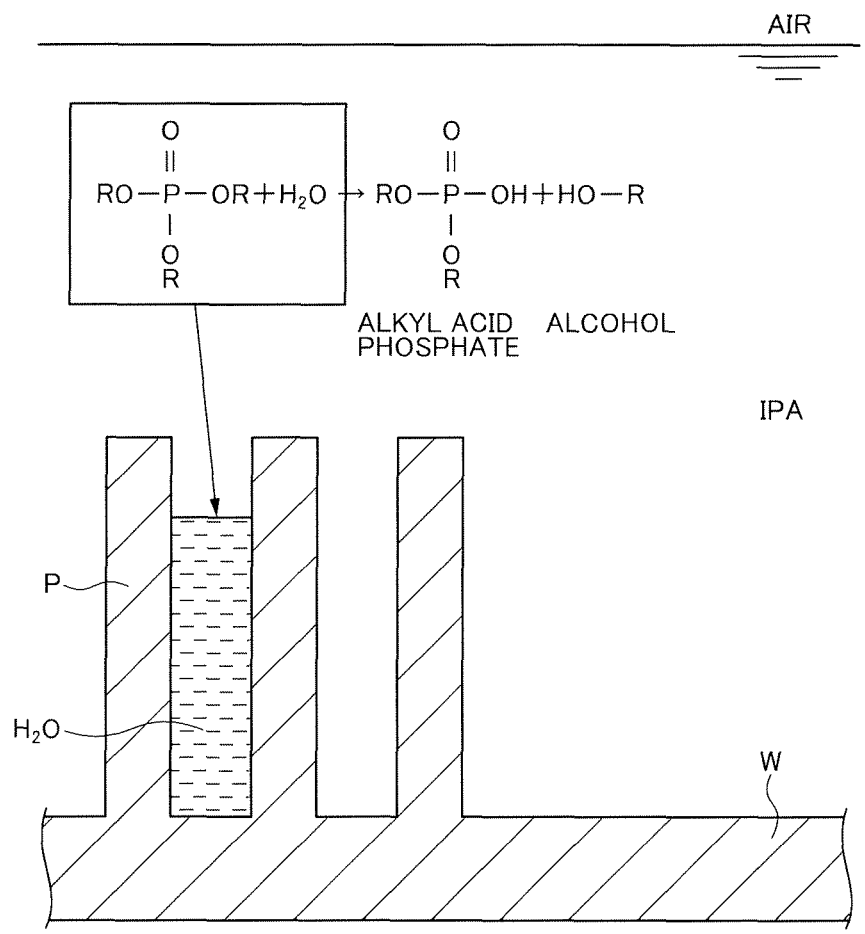
FIG. 3 is a schematic view illustrating a state of replacement of cleaning water on a substrate surface.

The water removing agent supplied from the water removing unit 110 may be a substance that reacts with water to hydrolyze, and is, for example, a triethyl phosphate or trimethyl phosphate. When the water removing unit 110 supplies the water removing agent to the surface of the substrate W through a supply passage to be described later, the water removing agent reacts, as illustrated in FIG. 3, with water remaining inside the gaps between the patterns P of the substrate W as well as water vapor in an atmosphere (air) which is present in the processing box 51 and around the substrate W, and hydrolyzes to produce a decomposition product. Accordingly, the water removing agent such as the triethyl phosphate or the trimethyl phosphate produces the decomposition product such as alkyl acid phosphate or alcohol while removing such water and water vapor. The decomposition product of the water removing agent such as the alkyl acid phosphate or the alcohol is easily mixed or dissolved in the volatile solvent such as IPA.

Accordingly, the water supplied from the cleaning water supply unit 57 to the surface of the substrate W is stirred and mixed with the IPA supplied from the solvent supply unit 58. At the same time, the water is spun off and removed by a centrifugal force caused by the rotation of the table 53, and is also removed by being consumed in the foregoing hydrolyzing of the water removing agent supplied by the water removing unit 110. Consequently, throughout the surface of the substrate W, the water can be reliably replaced with the IPA (into which the decomposition product of the water removing agent is mixed or dissolved) having a smaller surface tension than the water.

In the embodiment, as illustrated in FIG. 2, the water removing unit 110 adds the water removing agent (R) to the volatile solvent in the solvent supply tank 101. The water removing agent is supplied into the solvent supply tank 101 through a flow control valve 111 and a flow meter 112, is sufficiently mixed with the IPA in the solvent supply tank 101, and is discharged by the pump 105 from the nozzle 58A through the solvent supply passage 104 to the surface of the substrate W together with the IPA. The water removing unit 110 has the flow control valve 111 and the like electrically connected to the controller 60, and controls the driving thereof. For sufficiently mixing the water removing agent R and the volatile solvent in the solvent supply tank 101, the pump 105 preferably starts to circulate the mixture liquid in the solvent supply tank 101 in the state where the flow control valve 107 is closed and the return valve 109 is open.

The water removing agent supplied by the water removing unit 110 is sufficiently mixed with the IPA in the solvent supply tank 101, and spreads together with the IPA to various portions of the surface of the substrate W. This allows efficient replacement with the IPA (into which the decomposition product of the water removing agent is mixed or dissolved) throughout the surface of the substrate W.

The controller 60 includes a microcomputer that centrally controls the various portions, and a storage storing substrate processing information relating to the substrate processing, various kinds of programs and the like. The controller 60 controls, based on the substrate processing information and various programs, the rotation mechanism 54, solvent suction discharging unit 55, chemical solution supply unit 56, cleaning water supply unit 57, solvent supply unit 58, water removing unit 110 and the like, and controls the supplying of the chemical solution by the chemical solution supply unit 56, supplying of the cleaning water by the cleaning water supply unit 57, supplying of the volatile solvent by the solvent supply unit 58 performed on the surface of the substrate W on the rotating table 53, and the like.

Figure 4:
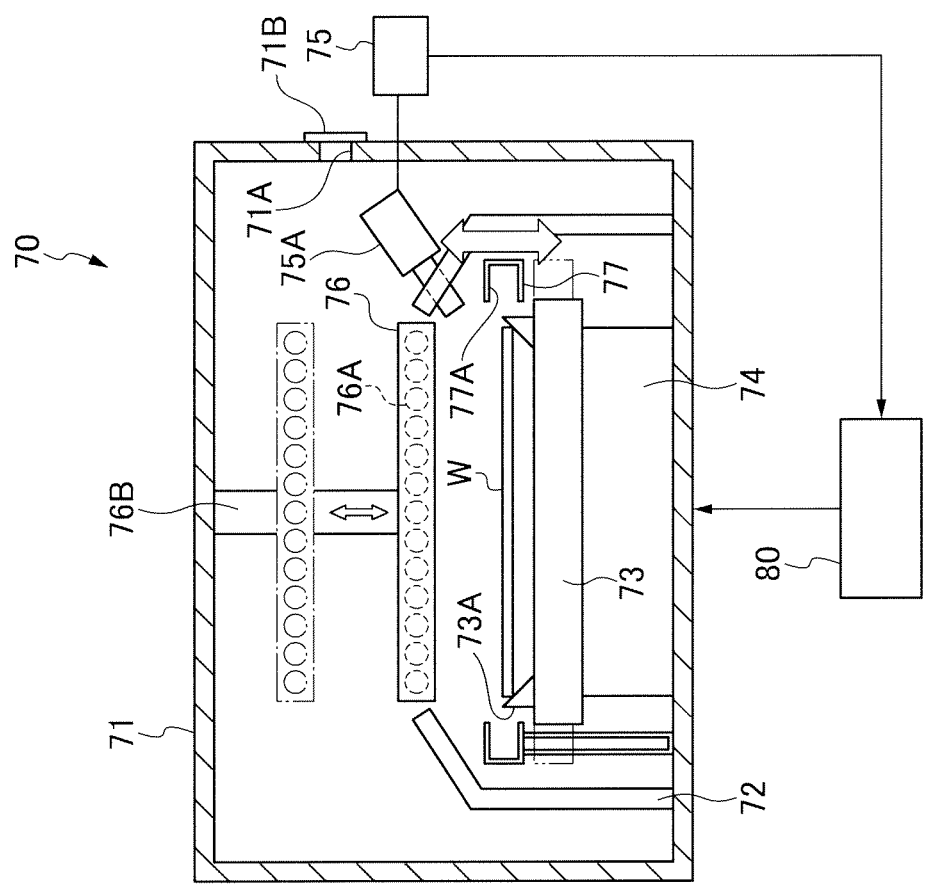
FIG. 4 is a schematic view illustrating a structure of a substrate drying chamber in the substrate processing device.

The substrate drying chamber 70 includes, as illustrated in FIG. 4, a processing box 71 serving as a processing chamber, a cup 72 arranged in the processing box 71, a table 73 horizontally carrying the substrate W in the cup 72, a rotation mechanism 74 rotating the table 73 in a horizontal plane, a gas supply unit 75 supplying a gas, a heating unit 76 heating the surface of the substrate W supplied with the volatile solvent, a suction drying unit 77 for drying the surface of the substrate W heated by the heating unit 76, and a controller 80 controlling various portions and units.

The processing box 71, the cup 72, the table 73, and the rotation mechanism 74 are similar to the processing box 51, the cup 52, the table 53, and the rotation mechanism 54 in the substrate cleaning chamber 50, respectively. In FIG. 4, 71A indicates a substrate inlet/outlet opening 71B indicates a shutter, and 73A indicates a support member such as a pin.

The gas supply unit 75 has a nozzle 75A discharging a gas obliquely to the surface of the substrate W on the table 73. The nozzle 75A supplies a gas such as a nitrogen gas to the surface of the substrate W on the table 73 to provide a nitrogen gas atmosphere in a space on the surface of the substrate W in the processing box 71. The nozzle 75A is attached to an upper portion of a peripheral wall of the cup 72, and an angle, a discharging flow velocity and the like of the nozzle 75A are adjusted to supply the gas to the vicinity of the surface center of the substrate W. This gas supply unit 75 is electrically connected to the controller 80, which controls the driving thereof. The gas supply unit 75 includes a tank storing the gas, a valve operating as a regulating valve for regulating the supply rate, and the like, although these are not illustrated.

As the supplied gas, an inert gas such as argon gas, carbon dioxide gas or helium gas other than nitrogen gas can be used. Since the inert gas is supplied to the surface of the substrate W, the oxygen on the surface of the substrate W can be removed, and production of watermarks can be prevented. The supplied gas may be dry air. Gas to be supplied is preferably a heated gas.

The heating unit 76 has a plurality of lamps 76A, and is arranged above the table 73. When each lamp 76A is turned on, it irradiates the surface of the substrate W on the table 73 with light. A moving mechanism 76B can vertically (in an elevating direction) move the heating unit 76 between a irradiation position close to the cup 72 (i.e., a position near the surface of the substrate W as indicated by the solid line in FIG. 4) and a standby position spaced from the cup 72 by a predetermined distance (i.e., a position spaced from the surface of the substrate W as indicated by alternate long and short dash line in FIG. 4). When the substrate W is to be set on the table 73 in the substrate drying chamber 70, the heating unit 76 is located in the standby position so that the heating unit 76 can be prevented from impeding the carrying-in of the substrate W. The heating unit 76 can be lowered after or before the turn-on of the lamp. The heating unit 76 is electrically connected to the controller 80, which controls the driving thereof.

The heating unit 76 may be formed of the plurality of lamps 76A, e.g., of a straight-tube type arranged in parallel, or the plurality of lamps 76A of a light ball type arranged in an array fashion. The lamp 76A may be, for example, a halogen lamp, xenon flash lamp or the like.

Figure 8A:
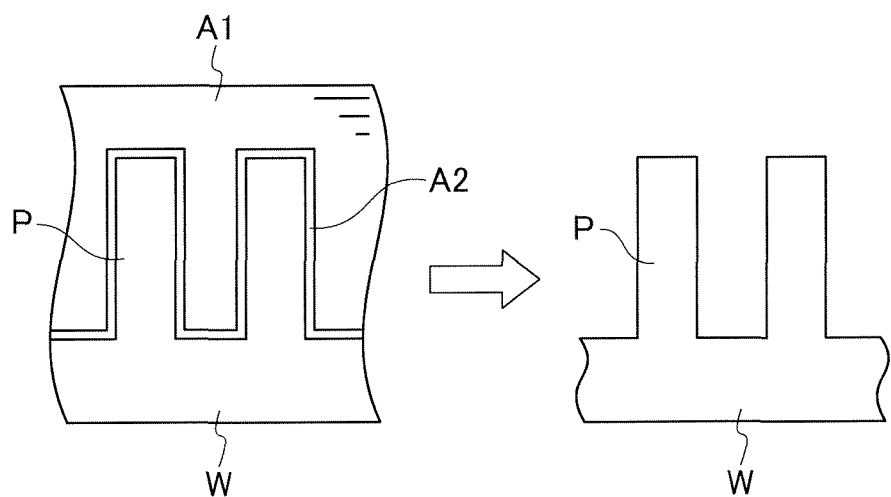
FIG. 8A and FIG. 8B are schematic views illustrating a state of drying of a volatile solvent on the substrate surface.
Figure 8B:
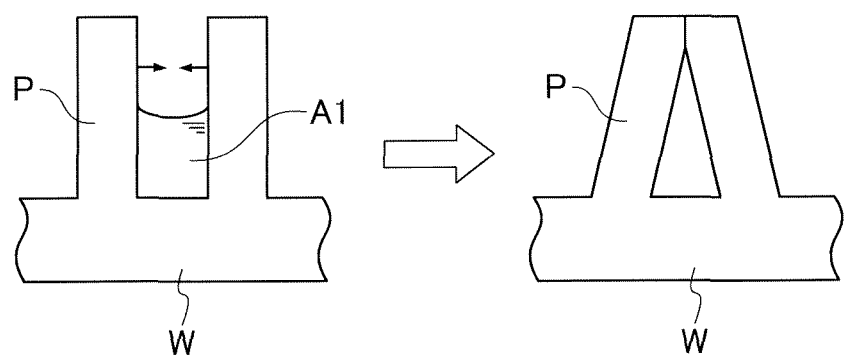

In heating of the substrate W using the heating unit 76, as illustrated in FIG. 8A, the heating by the heating unit 76 causes liquid A1 of the volatile solvent in contact with a pattern P on the surface of the substrate W to start evaporation earlier than the liquid A1 of the volatile solvent on the other portion. More specifically, in the liquid A1 of the volatile solvent supplied to the surface of the substrate W, only the liquid in contact with the surface of the substrate W is rapidly heated to attain the gas phase. Thereby gasification (boiling) of the liquid A1 of the volatile solvent forms a gas layer (collection of bubbles), namely a gas layer A2 of the volatile solvent taking a thin-film-like form around the pattern P on the surface of the substrate W. Therefore, the liquid A1 of the volatile solvent between the neighboring patterns P is pushed onto the surface of the substrate W by the gas layer A2, and its own surface tension changes the liquid A1 into many droplets. FIG. 8B illustrates a phenomenon in which, during drying of the liquid, various portions of the substrate surface are dried at uneven drying speeds so that the liquid A1 may be left between some patterns P, and the surface tension of the liquid A1 thus left collapses the pattern.

The suction drying unit 77 is substantially the same as the solvent suction discharging unit 55 in the substrate cleaning chamber 50. For the operation, it is set in the operation position where a solvent suction port 77A having an annular opening directed to the periphery of the table 73 is positioned around the substrate W held by the table 73. The solvent suction port 77A absorbs and receives the volatile solvent dispersed from the rotating substrate W. The suction drying unit 77 is electrically connected to the controller 80, which controls the operation thereof. The solvent suction port 77A is connected to a vacuum pump (not illustrated) for absorbing liquid droplets of the volatile solvent as well as a discharge pipe (not illustrated) for discharging the droplets of the volatile solvents thus absorbed and received.

The controller 80 includes a microcomputer centrally controlling various portions, and a storage storing the substrate processing information and various programs relating to the substrate processing. The controller 80 controls the rotation mechanism 74, gas supply unit 75, heating unit 76, suction drying unit 77 and the like based on the substrate processing information and the various programs, and further controls the gas supply by the gas supply unit 75, heating by the heating unit 76, suction by the suction drying unit 77, and the like effected on the surface of the substrate W on the rotating table 73.

Procedures of cleaning and drying the substrate W by the substrate processing device 10 will now be described below.

(1) The transporting robot 11 supplies the substrate W from the substrate storing cassette 21 of the substrate supply/discharge unit 20 to the in-dedicated buffer 31 of the substrate storing buffer unit 30, and the transporting robot 12 takes out and sets the supplied substrate W on the table 53 of the substrate cleaning chamber 50 in the substrate processing chamber 40. In this state, the controller 60 of the substrate cleaning chamber 50 controls the rotation mechanism 54 to rotate the table 53 at a predetermined rotation speed, and then controls the chemical solution supply unit 56 while positioning the solvent suction discharging unit 55 in the standby position so that the chemical solution, i.e., APM is supplied from the nozzle 56A to the surface of the substrate W on the rotating table 53 for a predetermined time. The chemical solution, i.e., APM is discharged from the nozzle 56A toward the center of the substrate W on the rotating table 53, and the centrifugal force caused by the rotation of the substrate W spreads it over the whole surface of the substrate W. Accordingly, the APM covers and processes the surface of the substrate W on the table 53.

The controller 60 continuously rotates the table 53 for a period from the above (1) to (3) to be described later. In this operation, the processing conditions such as a rotation speed of the table 53, a predetermined time and the like are set in advance, but an operator can arbitrarily change them.

(2) After stopping the supply of the chemical solution, the controller 60 then controls the cleaning water supply unit 57 to supply the cleaning water, i.e., ultrapure water from the nozzle 57A to the surface of the substrate W on the rotating table 53 for a predetermined time. The cleaning water, i.e., ultrapure water is discharged from the nozzle 57A toward the center of the substrate W on the rotating table 53, and is spread over the whole surface of the substrate W by the centrifugal force caused by rotation of the substrate W. Accordingly, the surface of the substrate W on the table 53 is covered and cleaned by the ultrapure water.

(3) After the supply of the cleaning water by the cleaning water supply unit 57 stopped, the controller 60 then locates the solvent suction discharging unit 55 in the operation position, and controls the solvent supply unit 58 to supply the volatile solvent, i.e., IPA from the nozzle 58A to the surface of the substrate W on the rotating table 53 for a predetermined time. After the supply of the IPA by the solvent supply unit 58 continued for a predetermined time, the solvent supply unit 58 stops the supply of the IPA, and the rotation of the substrate W by the table 53 stops. The volatile solvent, i.e., IPA is discharged from the nozzle 58A toward the center of the substrate W on the rotating table 53, and is spread over the whole surface of the substrate W by the centrifugal force caused by rotation of the substrate W. At this time, the solvent suction discharging unit 55 absorbs the IPA dispersing from the rotating substrate W. Accordingly, the ultrapure water on the surface of the substrate W on the table 53 is replaced with the IPA. The rotation speed of the substrate W, i.e., the table 53 in the above operation is substantially set such that a film of the volatile solvent formed over the surface of the substrate W is thin to an extent that the surface of the substrate W is not exposed.

The IPA discharged from the nozzle 58A of the solvent supply unit 58 is set to a temperature below a boiling point so that the IPA may be reliably in the liquid state when it is supplied to the surface of the substrate W, and thereby the ultrapure water may be reliably and uniformly replaced with the IPA on the whole surface of the substrate W. In this embodiment, the IPA in the liquid state is continuously supplied to the substrate W.

When the nozzle 58A of the solvent supply unit 58 discharges the IPA to the surface of the substrate W, the controller 60 controls the water removing unit 110 to supply the water removing agent to the surface of the substrate W by the water removing unit 110 as described before, and thereby promotes the replacement of the cleaning water on the surface of the substrate W with the IPA (in which the decomposition product of the water removing agent is mixed or dissolved).

(4) Then, the controller 60 stops rotation of the table 53 of the substrate cleaning chamber 50, and the transporting robot 12 takes out the substrate W on the rotation-stopped table 53 from the substrate cleaning chamber 50, and the substrate W is set on the table 73 of the substrate drying chamber 70 in the substrate processing chamber 40. The controller 80 of the substrate drying chamber 70 controls the rotation mechanism 74 to rotate the table 73, and also controls the gas supply unit 75 to supply the gas, i.e., the nitrogen gas from the nozzle 75A to the surface of the substrate W on the rotating table 73 for a predetermined time. The nozzle 75A discharges the nitrogen gas toward the whole area of the substrate W on the table 73. Accordingly, the nitrogen atmosphere is formed in the space containing the substrate W on the table 73. By keeping the nitrogen atmosphere in this space, the oxygen concentration is reduced to suppress generation of watermarks on the surface of the substrate W.

The controller 80 continuously rotates the table 73 from the above (4) to (6) to be described later. For this, the processing conditions such as the rotation speed of the table 73 and the predetermined time are preset, but an operator can arbitrarily change them.

(5) Then, the controller 80 controls the heating unit 76 to turn on each lamp 76A of the heating unit 76 to move the heating unit 76 in the standby position to the irradiation position, to heat the substrate W on the rotating table 73 for a predetermined time. At this time, the heating unit 76 can perform the heating that can raise the temperature of the substrate W to 100 degrees C. or above in 10 seconds. This can instantaneously vaporize the liquid A1 (in which the decomposition product of the water removing agent is mixed or dissolved) of the volatile solvent in contact with the pattern P on the surface of the substrate W, and can immediately form the droplets of the liquid A1 of the volatile solvent on the other portion of the surface of the substrate W.

In the above heat drying by the heating unit 76, it is important to heat the substrate W to a high temperature of hundreds of degrees C. within several seconds for instantaneously evaporating the volatile solvent, i.e., IPA (in which the decomposition product of the water removing agent is mixed or dissolved) in contact with the pattern P of the substrate W. It is necessary to heat only the substrate W without heating the IPA. For this, it is desirable to use the lamp 76A having a peak intensity in wavelengths of 500-3000 nm. For reliable drying, it is desirable that the final temperature of the substrate W attained by the heating is higher than the boiling points of the processing liquid and the solvent at an atmospheric pressure by 20° C. or more. Additionally, it is desirable that the time required for reaching the final temperature is substantially within 10 seconds and, for example, falls within a range from several tens of milliseconds to several seconds.

(6) The liquid droplets of the IPA (in which the decomposition product of the water removing agent is mixed or dissolved) produced on the surface of the substrate W by the heating operation of the heating unit 76 are dispersed radially outward by the centrifugal force caused by the rotation of the substrate W, and reach the suction drying unit 77. In this operation, the solvent suction port 77A has a suction force so that the liquid droplets of the IPA that reached the suction drying unit 77 are absorbed and removed through the solvent suction port 77A. Then, the rotation table 73 stops its rotation, and the drying ends. In the embodiment, therefore, the table 73, the rotation mechanism 74, the suction drying unit 77 and the like form the drying unit drying the surface of the substrate by removing the droplets of the volatile solvent that were produced on the surface of the substrate by the heating operation of the heating unit 76.

(7) Then, the controller 80 stops the rotation of the table 73. The transporting robot 12 takes out the substrate W already dried on the rotation-stopped table 73 from the substrate drying chamber 70, and brings the substrate W into the out-dedicated buffer 32 of the substrate storing buffer unit 30. When the out-dedicated buffer 32 is internally provided with the cooling unit as described before, this cooling unit forcedly cools the substrate W.

Before taking out the substrate W in the above (7), the controller 80 turns off the lamp 76A of the heating unit 76, and locates it in the standby position. Accordingly, the heating unit 76 does not impede the removal of the substrate W.

(8) The transporting robot 11 takes out the substrate W from the out-dedicated buffer 32 of the substrate storing buffer unit 30, and discharges it to the substrate storing cassette 21 of the substrate supply/discharge unit 20.

The supply of the nitrogen gas, which is supplied by the gas supply unit 75 for the predetermined time as described in the foregoing (4), may stop when the heating processing by the lamp 76A of the heating unit 76 in the foregoing (5) starts, or when the substrate W already subjected to the drying processing in the foregoing (6) is taken out from the substrate drying chamber 70 in the foregoing (7).

Thus, in the substrate processing device 10, the substrate processing chamber 40 has the substrate cleaning chamber 50 and the substrate drying chamber 70, and the transporting robot 12 serving as the substrate transporting unit is arranged between the substrate cleaning chamber 50 and the substrate drying chamber 70. Accordingly, the step of supplying the cleaning water to the surface of the substrate W as well as the step of supplying the volatile solvent to the surface of the substrate W supplied with the cleaning water and promoting the replacement of the cleaning water on the surface of the substrate W with the volatile solvent by the water removing unit 110 are performed in the substrate cleaning chamber 50. The substrate W supplied with the volatile solvent in the substrate cleaning chamber 50 is transferred by the transporting robot 12 to the substrate drying chamber 70. In the substrate drying chamber 70, the step of heating the substrate W supplied with the volatile solvent in the substrate cleaning chamber 50 as well as the step of removing the droplets of the volatile solvent produced on the surface of the substrate W by the heating of the substrate W to dry the surface of the substrate W are performed.

The embodiment achieves the following operations and effects.

When the solvent supply unit 58 supplies the IPA to the surface of the substrate W after the cleaning water supply unit 57 supplies the cleaning water to the surface of the substrate W, the water removing agent mixed in the IPA and supplied by the water removing unit 110 reacts to hydrolyze with the water remaining inside the pattern gaps of the substrate W as well as the water vapor in the atmosphere (air) which is present in the processing box 51 and around the substrate W, and thereby removes these water and water vapor. This can reduce the amount of the remaining cleaning water adhering to the surface of the substrate W and particularly remaining in the patter gaps, and consequently can replace reliably the cleaning water with the IPA (in which the decomposition product of the water removing agent is mixed or dissolved) of a low surface tension so that the pattern collapse at the time of drying of the substrate W can be effectively prevented.

Owing to the effect of removing the cleaning water by the water removing unit 110, the cleaning water on the surface of the substrate W can be efficiently replaced with the volatile solvent by supplying a relatively small amount of volatile solvent, and the amount of the consumed volatile solvent can be reduced. The volatile solvent can be smoothly fed into the pattern gaps of the substrate W in which the cleaning water is reduced in amount by the use of the water removing agent, and the execution time of the solvent replacing step can be reduced. This can improve the productivity of the substrates W.

The water removing agent supplied from the water removing unit 110 is well mixed with the IPA in the solvent supply tank 101, and spreads to the various portions of the surface of the substrate W together with the IPA. Therefore, the replacement with the IPA (in which the decomposition product of the water removing agent is mixed or dissolved) can be efficiently performed throughout the surface of the substrate W.

FIG. 6 illustrates a water removing unit 120 that is a modification of the water removing unit 110 additionally employed in the solvent supply unit 58 in the embodiment in FIGS. 1 to 5. The water removing unit 120 adds the water removing agent (R) to the volatile solvent in the solvent supply passage 104 of the solvent supply unit 58. The water removing agent is supplied to the solvent supply passage 104 through a flow control valve 121, a flow meter 122, and a filter 123, is positively taken and mixed into the flow of the IPA forcedly fed by the pump 105 through the solvent supply passage 104, and is discharged to the surface of the substrate W from the nozzle 58A together with the IPA. The controller 60 is electrically connected to the flow control valve 121 and others of the water removing unit 120 to control driving thereof.

The water removing agent supplied by the water removing unit 120 is positively mixed into the flow of the IPA forcedly fed through the solvent supply passage 104, and spreads together with the IPA to the various portions of the surface of the substrate W. Therefore, the replacement with the IPA (in which the decomposition product of the water removing agent is mixed or dissolved) can be efficiently performed throughout the surface of the substrate W.

FIG. 7 illustrates a water removing unit 130 that is a modification of the water removing unit 110 additionally employed in the solvent supply unit 58. The water removing unit 130 has a nozzle 130A discharging the water removing agent to the surface of the substrate W on the table 53 through a flow control valve 131, a flow meter 132, and a filter 133. The water removing unit 130 directly supplies the water removing agent (R) to the surface of the substrate W without passing it through the solvent supply passage 104 connected to the solvent supply tank 101, and thereby can add it to the volatile solvent discharged from the nozzle 58A of the solvent supply unit 58. The nozzle 130A is arranged under a ceiling of the processing box 51, and an installation angle, a discharging flow speed and others are adjusted to supply the water removing agent to a central surface portion of the substrate W. The controller 60 is directly connected to the flow control valve 131 and others of the water removing unit 130, and controls the driving thereof.

The supply of the water removing agent from the nozzle 130A may start simultaneously with the start of supply of the volatile solvent from the nozzle 58A, but may be earlier or later than the start of supply of the volatile solvent from the nozzle 58A. The supply of the water removing agent from the nozzle 130A may stop simultaneously with the supply of the volatile solvent from the nozzle 58A, but may stop earlier than it.

The water removing agent supplied from the water removing unit 130 is immediately mixed, on the surface of the substrate W, with the IPA supplied from the solvent supply unit 58, and spreads throughout the surface of the substrate W together with the IPA so that the replacement with the IPA (in which the decomposition product of the water removing agent is mixed or dissolved) can be efficiently performed throughout the surface of the substrate W.

Although the invention has been described in detail with reference to the drawings, the specific structure of the invention is not restricted to the embodiment, and the invention contains changes and variations of design within a scope not departing from the essence of the invention.

The operations of the gas supply unit 75 supplying the inert gas such as nitrogen gas and the drying air start after the substrate W is positioned in the supply position. However, these operations may start before such positioning.

In the embodiment, the heating of the substrate W by the heating unit 76 may be performed in a state where the pressure in the processing box 71 is reduced. This lowers the boiling point of the volatile solvent such as IPA in the processing box 71, and causes boiling at a temperature lower than that in the atmospheric pressure so that the heat damage to the substrate can be reduced.

In the embodiment, the supply of the volatile solvent such as IPA to the substrate W starts after the supply of the cleaning water to the substrate W stops. However, the supply of the volatile solvent may start while the supply of the cleaning water to the substrate W still continues in a final period of the cleaning with the cleaning water.

INDUSTRIAL APPLICABILITY

The invention reliably replaces the cleaning water on the substrate surface with the volatile solvent, and thereby can effectively prevent the pattern collapse at the time of substrate drying.

EXPLANATIONS OF LETTERS OF NUMERALS 10 substrate processing device
50 substrate cleaning chamber
57 cleaning water supply unit
58 solvent supply unit
70 substrate drying chamber
76 heating unit
77 suction drying unit (drying unit)
101 solvent supply tank
104 solvent supply passage
110, 120, 130 water removing unit
W substrate

The invention claimed is:

1. A substrate processing method comprising the steps of:
supplying a cleaning water to a surface of a substrate; and
supplying a volatile solvent in a liquid state to the surface of the substrate on which the cleaning water exists, and replacing the cleaning water with the volatile solvent, wherein
in the step of replacing the cleaning water with the volatile solvent, a water removing agent which reacts with the cleaning water is supplied to the substrate together with the supply of the volatile solvent, and
wherein the water removing agent is triethyl phosphate or trimethyl phosphate.

2. The substrate processing method according to claim 1, further comprising:
removing a droplet of the volatile solvent on the surface of the substrate by heating the surface of the substrate so as to dry the surface of the substrate.

3. The substrate processing method according to claim 2, further comprising:
rotating the substrate while heating the substrate, wherein the droplet of the volatile solvent is dispersed radially outward by a centrifugal force caused by the rotating of the substrate, and the dispersed droplet is absorbed and removed through a solvent suction port provided around the rotating substrate.

4. The substrate processing method according to claim 3, wherein
in the step of replacing the cleaning water, the volatile solvent and the water removing agent are supplied to the rotating substrate, and during the rotating of the substrate, a film of the volatile solvent is formed over the surface of the substrate so that the surface of the substrate is not exposed.

* * * * *